United States Patent
Snyder et al.

(10) Patent No.: US 8,912,425 B2
(45) Date of Patent: Dec. 16, 2014

(54) SELF-TUNING OF CARRIER CONCENTRATION FOR HIGH THERMOELECTRIC PERFORMANCE

(75) Inventors: G. Jeffrey Snyder, Pasadena, CA (US); Yanzhong Pei, Alhambra, CA (US)

(73) Assignee: California Institute of Technology, Pasadena, CA (US)

( * ) Notice: Subject to any disclaimer, the term of this patent is extended or adjusted under 35 U.S.C. 154(b) by 529 days.

(21) Appl. No.: 13/277,059

(22) Filed: Oct. 19, 2011

(65) Prior Publication Data

US 2012/0090656 A1    Apr. 19, 2012

Related U.S. Application Data

(60) Provisional application No. 61/394,408, filed on Oct. 19, 2010.

(51) Int. Cl.
*H01L 35/16*    (2006.01)
*H01L 35/26*    (2006.01)

(52) U.S. Cl.
CPC ............. *H01L 35/16* (2013.01); *H01L 35/26* (2013.01)

USPC ......... 136/238; 136/205; 252/62.3 S; 438/54; 438/102

(58) Field of Classification Search
None
See application file for complete search history.

(56) References Cited

U.S. PATENT DOCUMENTS

2005/0284512 A1 * 12/2005 Heremans et al. ......... 136/236.1

\* cited by examiner

*Primary Examiner* — Jayne Mershon
(74) *Attorney, Agent, or Firm* — Brian T. Duke; Nixon Peabody LLP

(57) ABSTRACT

The inventors demonstrate herein that homogeneous Ag-doped $PbTe/Ag_2Te$ composites exhibit high thermoelectric performance (~50% over La-doped composites) associated with an inherent temperature induced gradient in the doping concentration caused by the temperature-dependent solubility of Ag in the PbTe matrix. This method provides a new mechanism to achieve a higher thermoelectric efficiency afforded by a given material system, and is generally applicable to other thermoelectric materials.

12 Claims, 5 Drawing Sheets

SELF-TUNING OF CARRIER CONCENTRATION FOR HIGH THERMOELECTRIC PERFORMANCE

CROSS-REFERENCE TO RELATED APPLICATIONS

This application claims priority from U.S. Provisional Patent Application No. 61/394,408, filed on Oct. 19, 2010, which is incorporated herein by reference in its entirety.

GOVERNMENT RIGHTS

This invention was made with government support under W911NF-08-C-0058 awarded by the Army Research Office. The government has certain rights in the invention.

FIELD OF INVENTION

The invention relates to thermoelectric materials with high thermoelectric performance.

BACKGROUND

Doping in thermoelectrics generally results in performance optimized only in a small temperature window, due to the near constant carrier density resulting from the temperature independent activity of extrinsic dopants. Functionally graded materials with a compositional gradient of dopants can improve performance, but are difficult to fabricate. Thus, there is a need in the art for a new mechanism to achieve a higher thermoelectric efficiency afforded by a given material system.

SUMMARY OF THE INVENTION

In certain embodiments, the invention teaches a composite including excess dopant, wherein the excess dopant has an increasing solubility limit with increasing temperature (T). In some embodiments, the composite includes PbTe/Ag$_2$Te. In some embodiments, the excess dopant includes Ag. In some embodiments, the increasing solubility limit with increasing T is within a temperature range of high thermoelectric performance. In some embodiments, the composite has a dimensionless figure of merit (zT) of no less than 1.4 at 750 K. In certain embodiments, the temperature-dependent solubility limit of the dopant in the composite material results in an increase in carrier concentration (n) with increasing T. In certain embodiments, the composite is represented by a formula: $(Ag_xPbTe)_{0.945}(Ag_2Te)_{0.055}$. In some embodiments, $0.005 \leq x \leq 0.1$. In some embodiments, the composite is selected from the group consisting of: PbTe/Ag$_2$Te, PbTe/Ag$_2$Se, PbTe/Cu$_2$Te, PbTe/Cu$_2$Se, PbSe/Ag$_2$Te, PbSe/Cu$_2$Te, PbSe/Ag$_2$Se, PbSe/Cu$_2$Se, PbTe/CdTe, PbTe/MnTe, PbSe/CdSe, PbSe/MnSe, CoSb$_3$/InSb, CoSb$_3$/GaSb, GeSi/B, GeSi/P, Zn$_4$Sb$_3$/ZnSb, Bi$_2$Te$_3$/In$_2$Te$_3$, Bi$_2$Te$_3$/Ga$_2$Te$_3$, Sb$_2$Te$_3$/In$_2$Te$_3$, and Sb$_2$Te$_3$/Ga$_2$Te$_3$.

In certain embodiments, the dopant is selected from the group consisting of: silver (Ag), copper (Cu), gold (Au), nickel (Ni), zinc (Zn), lithium (Li), sodium (Na), potassium (K), indium (In), gallium (Ga), boron (B), phosphorus (P), and arsenic (As)

In some embodiments, the invention teaches a method of manufacturing a composite, including: heating a first material including at least a first element and a second material including at least a second element to form a mixture; cooling the mixture to precipitate nanoinclusions comprising the second element; annealing the mixture; and doping the mixture with excess dopant having an increasing solubility limit with increasing temperature (T). In certain embodiments, the first element of the first material includes Pb. In some embodiments, the first material further includes Te. In some embodiments, the second element of the nanoinclusions includes Ag. In some embodiments, the nanoinclusions further include Te. In certain embodiments, the increasing solubility limit with increasing T is within a temperature range of high thermoelectric performance. In some embodiments, the composite has a dimensionless figure of merit (zT) of no less than 1.4 at 750 K. In some embodiments, the temperature-dependent solubility limit of the dopant in the composite material results in an increase in carrier concentration (n) with increasing T. In certain embodiments, the composite is represented by a formula: $(Ag_xPbTe)_{0.945}(Ag_2Te)_{0.055}$. In some embodiments, $0.005 \leq x \leq 0.1$.

In some embodiments, the invention teaches a method of using a composite in a thermoelectric device, wherein the thermoelectric device includes a composite including excess dopant, and wherein the dopant has an increasing solubility limit with increasing temperature (T), within a temperature range of high thermoelectric performance. In certain embodiments, the method further includes: applying a temperature gradient to the thermoelectric device; and collecting electrical energy. In certain embodiments, the composite includes PbTe/Ag$_2$Te. In certain embodiments, the dopant includes Ag. In some embodiments, the increasing solubility limit with increasing T is within a temperature range of high thermoelectric performance. In some embodiments, the composite has a dimensionless figure of merit (zT) of no less than 1.4 at 750 K. In some embodiments, the temperature-dependent solubility limit of the dopant in the composite material results in an increase in carrier concentration (n) with increasing temperature (T). In certain embodiments, the composite is represented by a formula: $(Ag_xPbTe)_{0.945}(Ag_2Te)_{0.055}$. In certain embodiments, $0.005 \leq x \leq 0.1$.

In certain embodiments, the composite is selected from the group consisting of: PbTe/Ag$_2$Te, PbTe/Ag$_2$Se, PbTe/Cu$_2$Te, PbTe/Cu$_2$Se, PbSe/Ag$_2$Te, PbSe/Cu$_2$Te, PbSe/Ag$_2$Se, PbSe/Cu$_2$Se, PbTe/CdTe, PbTe/MnTe, PbSe/CdSe, PbSe/MnSe, CoSb$_3$/InSb, CoSb$_3$/GaSb, GeSi/B, GeSi/P, Zn$_4$Sb$_3$/ZnSb, Bi$_2$Te$_3$/In$_2$Te$_3$, Bi$_2$Te$_3$/Ga$_2$Te$_3$, Sb$_2$Te$_3$/In$_2$Te$_3$ and Sb$_2$Te$_3$/Ga$_2$Te$_3$.

In some embodiments, the dopant is selected from the group consisting of: silver (Ag), copper (Cu), gold (Au), nickel (Ni), zinc (Zn), lithium (Li), sodium (Na), potassium (K), indium (In), gallium (Ga), boron (B), phosphorus (P), arsenic (As).

DESCRIPTION OF THE INVENTION

Figure 1:
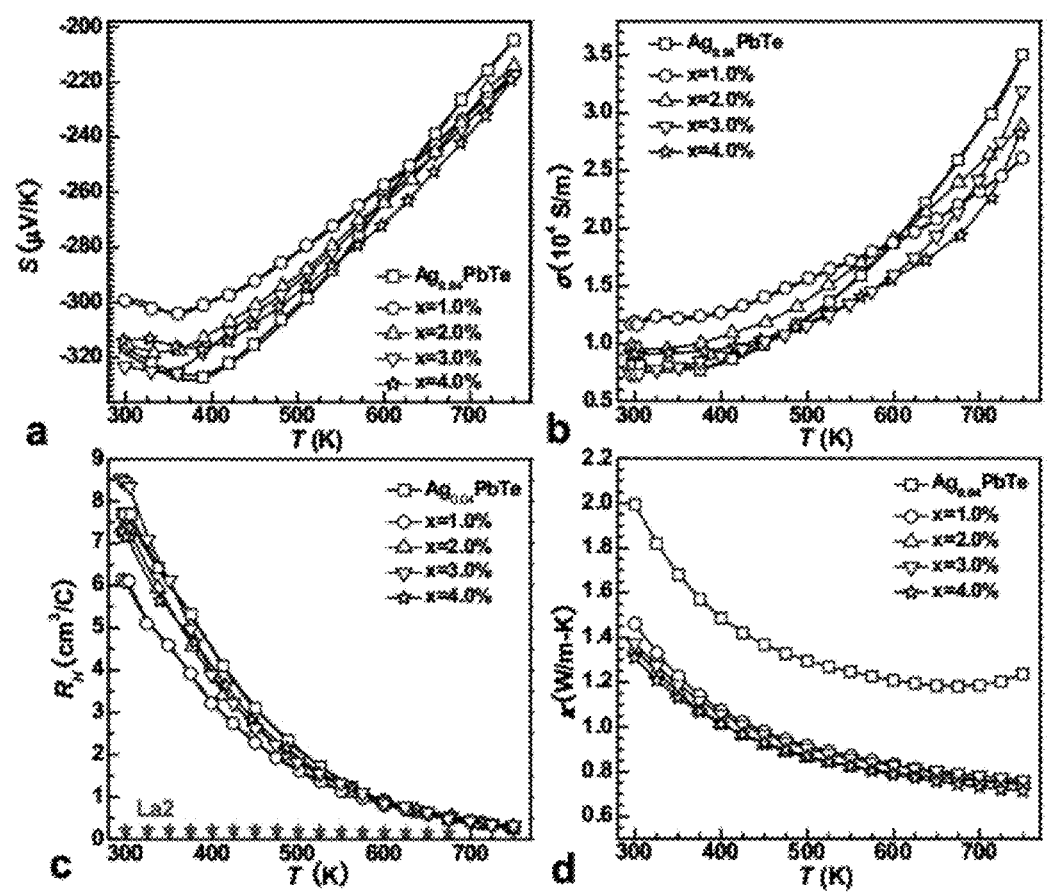
FIG. 1 demonstrates, in accordance with an embodiment of the invention, temperature dependent Seebeck coefficient (a), electrical conductivity (b), Hall coefficient (c) and thermal conductivity (d). The solid lines (blue) in (a), (b) and (c) show the two band model solution.

All references cited herein are incorporated by reference in their entirety as though fully set forth. Unless defined otherwise, technical and scientific terms used herein have the same meaning as commonly understood by one of ordinary skill in the art to which this invention belongs.

A high efficiency thermoelectric (TE) generator requires a high materials level figure-of-merit, $zT=S^2\sigma T/(\kappa_E+\kappa_L)$, sustained over a large temperature range [1]. The Seebeck coefficient (S), electrical conductivity ($\sigma$) and electronic thermal conductivity ($\kappa_E$) are sensitively interdependent via carrier concentration (n), and thus high average zT can be obtained by tuning n. Optimizing n and minimizing the lattice thermal conductivity ($\kappa_L$) via phonon scattering have been two permanent strategies in the field of TE materials [2, 3].

Non-isoelectronic substitutions (doping) are usually employed to introduce free carriers at the relatively high concentrations needed for TE, typically between $10^{19}$-$10^{21}$/$cm^3$ [4]. This approach generally leads to a nearly temperature-independent n [5-7] at the operational temperatures. However, the optimum carrier density $n_{opt}$ generally increases with increasing T, and as a consequence zT tends to only be optimized in a limited T range for a given material with fixed dopant concentration.

Greater performance can be obtained by grading the carrier concentration (known as functionally-graded materials) between the cold and hot junctions [10, 11]. While a homogeneous material typically has constant n, a traditional FGM material has composition changing with position. As one of the most heavily used thermoelectric materials in the temperature range of 500 to 750 K, n-type PbTe has $n_{opt}$ of only $\sim 10^{19}$/$cm^3$ at 600-700K [9, 10]. Therefore, the dopant control is very challenging and making graded compositions within such a narrow window of dopant concentration is especially difficult. TE materials with larger m* are easier to control because of the larger and broader range of $n_{opt}$ (e.g. $10^{20}$-$10^{21}$/$cm^3$ in $CoSb_3$ [13] $La_{3-x}Te_4$ [14] and $Yb_{14}MnSb_{11}$ [15]).

In thermoelectric PbSe and PbTe systems, metallic Cu, Ag [16, 17] (in PbSe) and Pb [10] (in PbTe) are found to possess an increasing solubility limit (on the order of $10^{19}$ $cm^{-3}$) with increasing T within the temperature range of high TE performance. The more dissolved dopant elements (Cu, Ag and Pb) will release more charge carriers at higher temperature.

The inventors demonstrate that homogeneous Ag-doped $PbTe/Ag_2Te$ composites exhibit high thermoelectric performance (~50% over La-doped composites) associated with an inherent temperature induced gradient in the doping concentration caused by the temperature-dependent solubility of Ag in the PbTe matrix. This method provides a new mechanism to achieve a higher thermoelectric efficiency afforded by a given material system, and should be generally applicable to other thermoelectric materials.

Unless otherwise stated, carrier density and carrier concentration are used interchangeably in the instant disclosure.

Unless otherwise stated, a nanocomposite, composite material and an article of manufacture are used interchangeably in the instant disclosure. In some portions of the disclosure, a nanocomposite, composite material or article of manufacture is also referred to as a sample.

In some embodiments, the numbers expressing quantities of ingredients, properties such as molecular weight, reaction conditions, and so forth, used to describe and claim certain embodiments of the application are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Some embodiments of the instant disclosure are directed to a composite material comprising a matrix and nanoinclusions, wherein the nanoinclusions are uniformly dispersed in the matrix, and wherein the composite material has a thermoelectric figure of merit (zT) of at least 1. In certain embodiments, zT is at least about 1.4 at 750 K. The nanoinclusions can scatter phonons effectively, leading to a low lattice thermal conductivity $\kappa_L$. The composite material also includes an excess of at least one dopant to optimize carrier density. The dopant has an increasing solubility limit with increasing temperature, within a temperature range of high thermoelectric performance. The temperature-dependent solubility limit of the dopant in the composite material results in an increase in carrier concentration (n) with increasing temperature (T).

In some embodiments, the matrix includes at least one composition selected from lead (Pb), selenium (Se), tellurium (Te), antimony (Sb), germanium (Ge), silicon (Si), tin (Sn), bismuth (Bi), arsenic (As), indium (In), thallium (Tl), and the like, or an alloy thereof. In an exemplary embodiment, the matrix includes PbTe. In some embodiments, the matrix includes at least one composition selected from the group consisting of: PbSe, SnTe, SnSe, GeTe, $Bi_2Te_3$, $Bi_2Se_3$, $Sb_2Te_3$, $Sb_2Se_3$, GeSi, $CoSb_3$, ZrNiSn, TiCoSb, $Zn_4Sb_3$ and the like, or an alloy thereof. In some embodiments, the matrix includes a narrow-gap semiconductor. In some embodiments, the matrix has nanoscale features of less than 1 micrometer, or less than 800 nanometers, or less than 600 nanometers, or less than 400 nanometers, or less than 200 nanometers, or less than 100 nanometers, or less than 80 nanometers, or less than 60 nanometers, or less than 40 nanometers, or less than 20 nanometers.

In some embodiments, the nanoinclusions are not isostructural to the matrix. For example, the dimension of the nanoinclusions is larger than the nanoscale features of the matrix so that they enhance the phonon scattering, which can reduce the lattice thermal conductivity $\kappa_L$. In some embodiments, the nanoinclusions have dimensions (along its minor axis if the shape is not isometric) of larger than 20 nanometers, or larger than 40 nanometers, or larger than 50 nanometers, or larger than 60 nanometers, or larger than 80 nanometers, or larger than 100 nanometers, or larger than 120 nanometers, or larger than 150 nanometers, or larger than 180 nanometers, or larger than 200 nanometers, or larger than 250 nanometers, or larger than 300 nanometers, or larger than 400 nanometers, or larger than 500 nanometers. In some embodiments, the nanoinclusions have dimensions (along its major axis if the shape is not isometric) of less than 1 micrometer, or less than 800 nanometers, or less than 600 nanometer, or less than 500 nanometers, or less than 400 nanometers, or less than 300 nanometers, or less than 250 nanometers, or less than 200 nanometers, or less than 150 nanometers, or less than 100 nanometers, or less than 80 nanometers, or less than 60 nanometers, or less than 50 nanometers. In some embodiments, the article includes some smaller nanoinclusions in addition to large nanoinclusions. Merely by way of example, an article includes a matrix with nanoscale features of close to or less than 20 nanometers, large nanoinclusions of 50 nanometers-200 nanometers and small nanoinclusions of less than 50 nanometers. A nanoinclusion can have a shape roughly of a sphere, a rod, a cylinder, an ellipsoid, a plate, and the like. As used herein, "roughly" indicates that the shape of a nanoinclusion may not be perfect. In some embodiments, the nanoinclusions in the matrix have a relatively large scale with at least one dimension that is larger than 200 nanometers, or larger than 400 nanometers, or larger than 500 nanometers, or larger than 600 nanometers, or larger than 800 nanometers. In some embodiments, at least one dimension of the nanoinclusions in the matrix is larger than 1 micrometer. The nanoinclusions with relatively large scale are effective in enhancing phonon scattering, and thereby lowering lattice thermal conductivity $\kappa_L$ and improving the thermoelectric performance of the composite material. In some embodiments, the nanoinclusions are dispersed in the matrix uniformly. In some embodiments, the nanoinclusions are dispersed in the matrix at some other pattern. In some embodiments, the nanoinclusions are dispersed in the matrix randomly. In some embodiments, the average number density of the nanoinclusions in a matrix is from 1 per cubic micrometer to about 200 per cubic micrometer, or from 5 per cubic micrometer to 150 per cubic micrometer, or from 10 per cubic micrometer to 120 per cubic micrometer, or from 20 per cubic micrometer to 100 per cubic micrometer, or from 30 per cubic micrometer to 80 per cubic micrometer, or from 40 per cubic micrometer to 60 per cubic micrometer. In some embodiments, the average number density of the nanoinclusions in a matrix is from 1 per cubic micrometer to about 10 per cubic micrometer, or from 10 per cubic micrometer to about 20 per cubic micrometer, or from 20 per cubic micrometer to about 40 per cubic micrometer, or from 40 per cubic micrometer to about 60 per cubic micrometer, or from 60 per cubic micrometer to about 80 per cubic micrometer, or from 80 per cubic micrometer to about 100 per cubic micrometer, or higher than 100 per cubic micrometer. In some embodiments, the spacing between nanoinclusions is from 10 nanometers to 10 micrometers, or from 50 nanometers to 5 micrometers, or from 100 nanometers to 1 micrometer, or from 150 nanometers to 500 nanometers, or from 200 nanometers to 300 nanometers. In some embodiments, the spacing between nanoinclusions is from 10 nanometers to 50 nanometers, or from 50 nanometers to 100 nanometers, or from 100 nanometers to 200 nanometers, or from 200 nanometers to 400 nanometers, or from 400 nanometers to 600 nanometers, or from 600 nanometers to 800 nanometers, or from 800 nanometers to 1000 nanometers, or larger than 1000 nanometers.

In some embodiments, the nanoinclusions (e.g., the size, shape, average number density) do not introduce considerable electronic doping effect to the matrix, and do not significantly affect the carrier density of the matrix. This way, the effect of the nanoinclusions on the improved thermoelectric figure of merit is due primarily to the reduced lattice thermal conductivity $\kappa_L$. The microstructural or nanostructural parameters of the nanoinclusions, including the size, spacing, and the like, can be controlled or adjusted by, for example, adjusting the conditions under which the article is formed. Merely by way of example, annealing time and temperature is proportional to the size growth of the nanoinclusions.

In some embodiments, the nanoinclusions introduce an electronic doping effect to the matrix such that, in addition to the reduced lattice thermal conductivity $\kappa_L$, the carrier density is improved, and the thermoelectric figure of merit is improved. The nanoinclusions can include, for example, silver (Ag), copper (Cu), antimony (Sb), cadmium (Cd), zinc (Zn), manganese (Mn), indium (In), gallium (Ga), cobalt (Co), boron (B), phosphorus (P), arsenic (As), and the like, or an alloy thereof. Merely by way of example, the nanoinclusions include an alloy of silver (Ag) and a constituent composition of the matrix, e.g., selenium (Se), tellurium (Te), and the like. In some embodiments, the composite material includes PbTe/Ag$_2$Te.

As previously indicated, thermoelectric performance of the composites disclosed herein can be improved by careful control of carrier concentrations through doping. In some embodiments, the composite is doped with an n-type dopant. Effective electron donor dopants (n-type dopants) include, for example, silver (Ag), copper (Cu), gold (Au), nickel (Ni), zinc (Zn), lithium (Li), sodium (Na), potassium (K), indium (In), gallium (Ga), boron (B), phosphorus (P), arsenic (As), and the like. The dopant concentration can be optimized for different composites including different constituent compositions. In a preferred embodiment, excess dopant is used. In exemplary embodiments, the dopant has an increasing solubility limit into the matrix material with increasing temperature. In some embodiments, the increasing solubility limit with increasing temperature is within a temperature range of high thermoelectric performance. In some embodiments, the temperature-dependent solubility limit of the dopant in the composite material results in an increase in carrier concentration (n) with increasing temperature (T). In some embodiments, the composite has a dimensionless figure of merit (zT) of no less than 1.4 at 750 K. In certain embodiments, the composite is represented by a formula: $(Ag_xPbTe)_{0.945}(Ag_2Te)_{0.055}$. In some embodiments, $0.005 \leq x \leq 0.1$.

In certain embodiments, carrier concentration (n) is at least $10^{18}$ per cubic centimeter, or at least $2 \times 10^{18}$ per cubic centimeter, or at least $4 \times 10^{18}$ per cubic centimeter, or at least $5 \times 10^{18}$ per cubic centimeter, or at least $6 \times 10^{18}$ per cubic centimeter, or at least $8 \times 10^{18}$ per cubic centimeter, or at least $10^{19}$ per cubic centimeter, or at least $2 \times 10^{19}$ per cubic centimeter, or at least $4 \times 10^{19}$ per cubic centimeter, or at least $5 \times 10^{19}$ per cubic centimeter, or at least $6 \times 10^{19}$ per cubic centimeter, or at least $8 \times 10^{19}$ per cubic centimeter, or at least $10^{20}$ per cubic centimeter, or at least $2 \times 10^{20}$ per cubic centimeter, or at least $4 \times 10^{20}$ per cubic centimeter, or at least $5 \times 10^{20}$ per cubic centimeter. Merely by way of example, an optimal carrier concentration is $10^{18}$-$10^{19}$ per cubic centimeter at room temperature and $10^{19}$-$10^{20}$ per cubic centimeter at 700 K or above.

The following description regarding some exemplary embodiments of the composite material is for illustration purposes, and is not intended to limit the scope of the disclosure. In some exemplary embodiments, the composite material includes a matrix, including PbTe, nanoinclusions, including Ag$_2$Te, and excess dopant, including Ag. The matrix has small nanoscale features of less than 20 nanometers. The nanoinclusions are of relatively larger scale. The nanoinclusions are plate-like. Some nanoinclusions have long dimensions of 100-200 nanometers and short dimensions of 50-100 nanometers. Some nanoinclusions have long dimensions of larger than 200 nanometers, some are larger than 1 micrometer.

Some embodiments of the instant disclosure are directed to a method of manufacturing a composite material, including: heating a first material including at least a first element and a second material including at least a second element to form a mixture; cooling the mixture to precipitate nanoinclusions including the second element; annealing the mixture; and doping the mixture with excess dopant having an increasing solubility limit with increasing temperature.

In some embodiments, the heating melts the first material and the second material to form a homogeneous mixture or melt at a first temperature. The first temperature is higher, at a first temperature difference, than the higher of the melting temperature of the first material and that of the second material. The first temperature difference can be at least 1 K, or at least 2 K, or at least 5 K, or at least 8 K, or at least 10 K, or at least 12 K, or at least 15 K, or at least 20 K, or at least 25 K, or at least 30 K, or at least 35 K, or at least 40 K, or at least 45 K, or at least 50 K. The heating can be achieved at an essentially constant temperate increase rate. The temperate increase rate can be at least 10 K/hour, or at least 50 K/hour, or at least 80 K/hour, or at least 100 K/hour, or at least 120 K/hour, or at least 150 K/hour, or at least 180 K/hour, or at least 200 K/hour, or at least 220 K/hour, or at least 250 K/hour, or at least 280 K/hour, or at least 300 K/hour, or at least 320 K/hour, or at least 350 K/hour, or at least 380 K/hour, or at least 400 K/hour, or at least 420 K/hour, or at least 450 K/hour, or at least 480 K/hour, or at least 500 K/hour, or at least 520 K/hour, or at least 550 K/hour, or at least 580 K/hour, or at least 600 K/hour, or at least 650 K/hour, or at least 700 K/hour, or at least 750 K/hour, or at least 800 K/hour. The heating can be achieved at a variable temperature increase rate. The essentially constant or variable temperate increase rate can be achieved by controlling, for example, the rate of energy input to the heating process. In some embodiments, the heating is achieved in a closed chamber. In some embodiments, the heating is achieved at or close to the atmospheric pressure. In some embodiments, the heating is achieved under vacuum. Merely by way of example, the chamber pressure is of $10^{-5}$ torr or less. In some embodiments, the heating is achieved at a chamber pressure that is higher than the atmospheric pressure. In some embodiments, the heating lasts at least 0.1 hours, or at least 0.5 hours, or at least 1 hour, or at least 1.5 hours, or at least 2 hours, or at least 2.5 hours, or at least 3 hours, or at least 4 hours, or at least 5 hours, or at least 6 hours, or at least 7 hours, or at least 8 hours, or at least 10 hours, or at least 12 hours, or at least 15 hours, or at least 20 hours, or at least 24 hours, or at least 30 hours, or at least 36 hours, or at least 42 hours, or at least 48 hours.

In some embodiments, the first material includes a first element that forms a matrix of a composite material. The first material can include more constituent compositions of the matrix. The matrix includes at least one composition selected from lead (Pb), selenium (Se), tellurium (Te), antimony (Sb), germanium (Ge), silicon (Si), tin (Sn), bismuth (Bi), arsenic (As), indium (In), thallium (Tl), and the like, or an alloy thereof. In some exemplary embodiments, the matrix is selected from the group consisting of: PbTe, PbSe, SnTe, SnSe, GeTe, $Bi_2Te_3$, $Bi_2Se_3$, $Sb_2Te_3$, $Sb_2Se_3$, GeSi, $CoSb_3$, ZrNiSn, TiCoSb, $Zn_4Sb_3$, and the like, or an alloy thereof.

In some embodiments, the second material includes a second element that forms nanoinclusions of a composite material. Merely by way of example, the second element is selected from the group consisting of: silver (Ag), copper (Cu), antimony (Sb), cadmium (Cd), zinc (Zn), manganese (Mn), indium (In), gallium (Ga), cobalt (Co), boron (B), phosphorus (P), and arsenic (As). The second material can include more constituent compositions of the matrix or the nanoinclusions of an article of manufacture.

In some embodiments, the method of manufacturing the composite material includes cooling the mixture to precipitate nanoinclusions including the second element. The cooling is performed by contacting a coolant directly or indirectly with the mixture so that the mixture is at a second temperature. By cooling, the second element of the second material precipitates from the matrix to form nanoinclusions. The nanoinclusions include at least the second element. The nanoinclusions can further include other constituent compositions of the composite material. Merely by way of example, the nanoinclusions include an alloy of the second element. As used herein, "indirectly" means that the coolant and the mixture are separated from each other by a partition, e.g., the wall of a container holding the mixture. The coolant can be at least one medium selected from a liquid (e.g., oil, water, and the like), and a gas (air, an inert gas, and the like). Merely by way of example, the cooling is achieved by cold water quenching. The second temperature is lower, at a second temperature difference, than the melting temperature of at least one of the first material and the second material. The second temperature difference can be at least 1 K, or at least 2 K, or at least 5 K, or at least 8 K, or at least 10 K, or at least 12 K, or at least 15 K, or at least 20 K, or at least 25 K, or at least 30 K, or at least 35 K, or at least 40 K, or at least 45 K, or at least 50 K, or at least 80 K, or at least 100 K, or at least 150 K, or at least 200 K, or at least 250 K, or at least 300 K, or at least 350 K, or at least 400 K, or at least 450 K, or at least 500 K, or at least 550 K, or at least 600 K. The cooling can be achieved at an essentially constant temperate decrease rate. The temperate decrease rate can be at least 10 K/hour, or at least 50 K/hour, or at least 80 K/hour, or at least 100 K/hour, or at least 120 K/hour, or at least 150 K/hour, or at least 180 K/hour, or at least 200 K/hour, or at least 220 K/hour, or at least 250 K/hour, or at least 280 K/hour, or at least 300 K/hour, or at least 320 K/hour, or at least 350 K/hour, or at least 380 K/hour, or at least 400 K/hour, or at least 420 K/hour, or at least 450 K/hour, or at least 480 K/hour, or at least 500 K/hour, or at least 520 K/hour, or at least 550 K/hour, or at least 580 K/hour, or at least 600 K/hour, or at least 650 K/hour, or at least 700 K/hour, or at least 750 K/hour, or at least 800 K/hour. The cooling can be achieved at a variable temperate decrease rate. The essentially constant or variable temperate decrease rate can be controlled by, for example, the flow rate of the coolant.

In some embodiments, the method of manufacturing the composite material includes annealing the mixture. The mixture is annealed at a third temperature. The third temperature is lower, at a third temperature difference, than the lower of the melting temperature of the first material and that of the second material. The third temperature difference can be at least 1 K, or at least 2 K, or at least 5 K, or at least 8 K, or at least 10 K, or at least 12 K, or at least 15 K, or at least 20 K, or at least 25 K, or at least 30 K, or at least 35 K, or at least 40 K, or at least 45 K, or at least 50 K, or at least 80 K, or at least 100 K, or at least 150 K, or at least 200 K, or at least 250 K, or at least 300 K, or at least 350 K, or at least 400 K, or at least 450 K, or at least 500 K, or at least 550 K, or at least 600 K. In some embodiments, the annealing lasts at least 0.1 hours, or at least 0.5 hours, or at least 1 hour, or at least 1.5 hours, or at least 2 hours, or at least 2.5 hours, or at least 3 hours, or at least 4 hours, or at least 5 hours, or at least 6 hours, or at least 7 hours, or at least 8 hours, or at least 10 hours, or at least 12 hours, or at least 15 hours, or at least 20 hours, or at least 24 hours, or at least 30 hours, or at least 36 hours, or at least 42 hours, or at least 48 hours, or at least 54 hours, or at least 60 hours, or at least 66 hours, or at least 72 hours, or at least 78 hours, or at least 84 hours, or at least 90 hours, or at least 96 hours.

Operation conditions including, for example, the temperature decrease rate (or cooling rate), annealing time and temperature, and the like, or a combination thereof, can affect the microstructure or nanostructure of the article including the microstructure or nanostructure of the matrix and/or of the nanoinclusions. Merely by way of example, annealing time and temperature is proportional to the size growth of the nanoinclusions. In some embodiments, the annealing time and temperature are chosen to achieve desired the microstructure or nanostructure of the article including the microstructure or nanostructure of the matrix and/or of the nanoinclusions. In some embodiments, the annealing is repeated to further improve or adjust the microstructure or nanostructure of the article (e.g., by improving or adjusting the microstructural or nanostructural parameters of the nanoinclusions), at the same condition as the previous annealing process, or at a different condition.

In some embodiments, the method of manufacturing the composite material includes further cooling and/or further annealing. The cooling can be repeated at least once, at the same condition as the previous cooling process, or at a different condition. The annealing can be repeated, at the same condition as the previous annealing process, or at a different condition.

In some embodiments, the method of manufacturing the composite material includes doping the material with excess dopant. Effective electron donor dopants (n-type dopants) include, for example, silver (Ag), copper (Cu), gold (Au), nickel (Ni), zinc (Zn), lithium (Li), sodium (Na), potassium (K), indium (In), gallium (Ga), boron (B), phosphorus (P), arsenic (As) and the like. The doping can be performed after the heating. In some embodiments, the doping is performed before the cooling. In some embodiments, the doping is performed before the annealing. In some embodiments, the doping is performed after the annealing.

A person of ordinary skill in the art, reading the instant disclosure, would know how to arrange the order and conditions for the cooling, annealing and doping processes to manufacture the described composite materials.

In some embodiments, the method of using the composite material includes applying a temperature gradient to the composite material; and collecting electrical energy. In some embodiments, the method of using the composite material includes applying electrical energy to the composite material; and transferring heat from a first space at a first operation temperature to a second space at a second operation temperature, wherein the first operation temperature is lower than the second operation temperature.

Merely by way of example, thermoelectric modules including the article of manufacture disclosed herein are used to harness waste heat from automotive exhaust (500 K-800 K) to produce electricity and reduce $CO_2$ emissions. The efficiency of such thermoelectric generators is determined by the temperature difference, yielding the Carnot limit, and the material efficiency.

One skilled in the art will recognize many methods and materials similar or equivalent to those described herein, which could be used in the practice of the present invention. Indeed, the present invention is in no way limited to the methods and materials described.

The following examples are for illustrative purposes only and are not intended to limit the scope of the disclosure or its various embodiments in any way.

EXAMPLES

Example 1

Generally

The inventors demonstrate herein a new mechanism for functionally grading composite materials, by utilizing the temperature dependence of a dopant concentration in the matrix in equilibrium with a reservoir of excess dopant. In this way, the thermoelectric properties are directly controlled by the temperature without requiring spatial control of the dopant concentration. With the combination of the inventors' previous achievement, of which $Ag_2Te$ (and others [18]) nano-precipitates in PbTe reduce $\kappa_L$ to near the amorphous limit and allow independent doping control that results in zT of ~1.5 at 775 K with La doping [7], an excess of metallic Ag is used to control the carrier density in $PbTe/Ag_2Te$ composites. The appropriate temperature-dependent solubility limit of Ag in $PbTe:Ag—Ag_2Te$ composite material enables an increase in n with increasing T. This allows a single material to be naturally functionally graded, enabling an average zT ~50% higher than composites optimized for performance at high temperature by La doping [7] (even though both have peak zT of about 1.4 at 750 K).

Example 2

Experiments and Results

Figure 2:
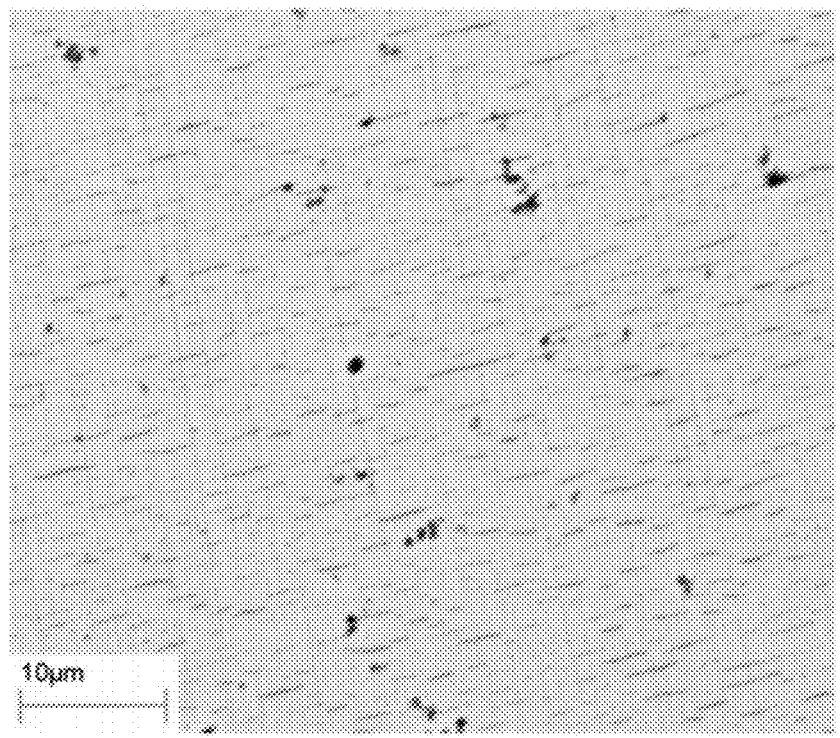
FIG. 2 demonstrates, in accordance with an embodiment of the invention, a back scattering image for Ag$_{0.01}$PbTe/Ag$_2$Te. The dark short plates are Ag$_2$Te and the black spots are metallic Ag.

Four $(Ag_xPbTe)_{0.945}(Ag_2Te)_{0.055}$ composites (x=0.01, 0.02, 0.03 and 0.04) were synthesized, as was $Ag_{0.04}PbTe$ for comparison; the experimental procedures and property measurement details can be found elsewhere [7]. FIG. 1 shows the temperature dependent Seebeck coefficient (a), electrical conductivity (b), Hall coefficient (c), and thermal conductivity (d). The varying of silver content from 1-4%, has little effect on the transport properties, indicating dopant saturation likely accompanied by the formation of a second phase. An image taken via scanning electron microscopy is shown in FIG. 2 for x=0.01. In addition to the expected nano-precipitates of $Ag_2Te$ (dark short plates), metallic Ag is also observed (the black spots), which is consistent with the suspicion that the solubility limit of Ag has been reached in all samples.

The increase in $\sigma$ and decrease in $|S|$ with increasing T is opposite to the behavior observed in the heavily doped semiconductors typically used as thermoelectric materials [3]. Rather, these trends are often observed in intrinsic semiconductors, where the behavior originates from the thermal activation of charge carriers across the band gap. However, this is not the case here, where the increase in carrier density is primarily due to an increase in the extrinsic n with increasing temperature, and minority carriers have little influence on the transport.

Figure 3:
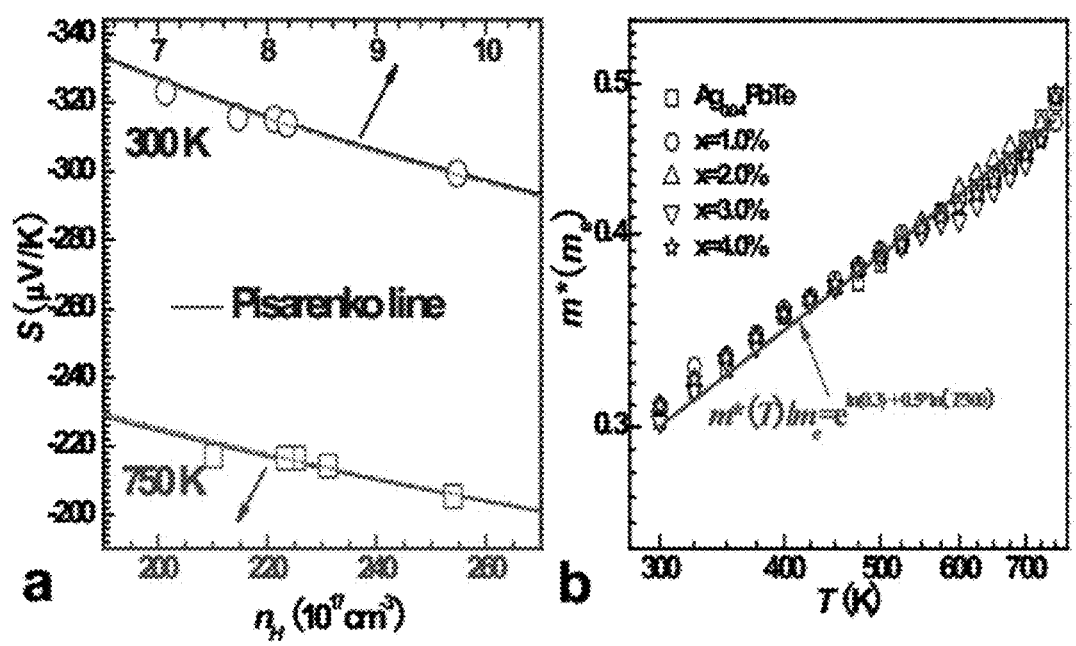
FIG. 3 demonstrates, in accordance with an embodiment of the invention, (a) S vs. $n_H$ compared with the Pisarenko relationships obtained by SPB (solid) and SKB (dotted) models at 300K [19] and 750 K. (b) Temperature dependent effective mass (SPB).

The room temperature Seebeck coefficient (FIG. 3a) fits the well-established Pisarenko relationship [19] of S on n for bulk PbTe. The experimental data are well described (at both low and high T, FIG. 3a) by a single parabolic band (SPB) model with temperature dependent effective mass and acoustic phonon scattering. This indicates that the conduction band at these doping levels is sufficiently parabolic [20, 21], particularly in weakly degenerate PbTe, which allows the SPB approximation to be utilized even though some non-parabolic effects are expected at high doping levels [19, 22]. For comparison, single Kane band models [19] (SKB), which take nonparabolicity into account, are also shown in FIG. 3 as dotted lines. The SKB are indistinguishable from the SPB in the n, T ranges considered here. The Hall carrier density ($n_H=1/eR_H$) is used to be consistent with the original literature.

Ag is an n-type dopant in Ag saturated PbTe because of the formation of interstitial Ag [23]. The agreement with the Pisarenko relationship suggests both Ag and La [7] dopants do not considerably modify the conduction band curvature of PbTe, further justifying the use of the parabolic model [19].

The SPB model with Fermi distribution, expresses the Seebeck coefficient and carrier density (n) as [3, 5, 19, 24]

$$S(\xi)=\pm k_B/e\{[(r+2.5)F_{r+1.5}(\xi)]/[(r+1.5)F_{r+0.5}(\xi)]-\xi\}, \quad (1)$$

$$n(\xi)=4\pi(2m^*k_BT/h^2)^{1.5}F_{0.5}(\xi), \quad (2)$$

respectively, where $\xi$, $k_B$, e, r, h, and m* are the reduced chemical potential, Boltzmann constant, electron charge, carrier scattering parameter, Plank constant and the density of state effective mass. For acoustic scattering, $r=-0.5$. $F_j(\xi)=\int_0^\infty x^j/[1+\exp(x-\xi)dx]$ is the Fermi integral with order j, and $\xi=E_F/k_BT$, where $E_F$ is the chemical potential measured from the bottom of the conduction band (BCB). With the experimental Seebeck coefficient, one can obtain $\xi$ from Eq. 1 by assuming r. Combining with the measured Hall coefficient, the carrier concentration can be obtained from $n=A/eR_H$ with numerical factor of $A=A_KA_r$, where $A_K\sim0.9$ due to the band anisotropy [25] and $$A_r = \frac{3}{2}\frac{2r+1.5F_{2r+0.5}(\xi)F_{0.5}(\xi)}{(r+1.5)^2F_{r+0.5}(\xi)^2}$$

due to the degeneracy [19]. With the known $\xi$ and n, m* can be calculated from Eq. 2 and the results are shown in FIG. 3b. The observed temperature dependence of m* is consistent with that in the PbTe literature [19, 25].

As shown in FIG. 1, the unusual temperature dependencies compared with other thermoelectric PbTe materials, suggest the probability of mixed conduction (electrons and holes). A mixed band model that takes the minority carriers into account is necessary to determine what impact minority carriers have on transport. In this model, $\sigma$, S and $R_H$ are expressed as [19]:

$$\sigma=\sigma_n+\sigma_p=ne\mu_n+pe\mu_p, \quad (3)$$

$$S=(S_n\sigma_n+S_p\sigma_p)/(\sigma_n+\sigma_p), \quad (4)$$

$$R_H=(A_n\sigma_n\mu_n+A_p\sigma_p\mu_p)/(\sigma_n+\sigma_p)^2, \quad (5)$$

where n and p are the concentrations of free electrons and holes, respectively; the subscripts n and p stand for the partial contribution due to electrons and holes, respectively.

The band gap ($E_g$) and carrier effective mass of PbTe is strongly temperature dependent due to thermal expansion and the interaction of carriers with the lattice vibrations [19]. Moreover, the first valence band (light-hole) edge falls below the second valence band (heavy-hole) at T~400 K [19]. Tsang et al. [26] estimated the $E_g$ for PbTe as:

$$E_g/eV(T)=4.2\times10^{-4}T+0.19(T<400\text{ K})=0.358(T>400\text{ K}) \quad (6)$$

which has been successfully used to calculated the transport properties of PbTe [22, 27]. To allow the Fermi integrals to be used as written, a reduced Fermi level for holes, $\xi_p=-\xi_n-E_g/k_BT$; is employed.

Many reports have shown that the temperature coefficient of effective mass, $\Delta=\partial\ln m^*/\partial\ln T$, is 0.5~0.6 at 300~700 K for n-type PbTe with low carrier densities ($<10^{18}\sim10^{19}$ cm$^{-3}$) [19]. Most importantly, both the present and our previous work on La-doped PbTe/Ag$_2$Te [7] show a $\Delta$ of 0.5 and a room temperature $m_n$* of 0.3 $m_e$ (FIG. 3b), in excellent agreement with literature values for n-PbTe [19, 25]. Thus $m_n$*(T) can be written as:

$$m_n^*(T)/m_e=\text{Exp}[\ln(0.3)+0.5^*\ln(T/300)] \quad (7)$$

The effective mass for holes is more complicated, a $\Delta$ of 0.8, as suggested in the literature [25], is taken for T<400 K and a room temperature $m_p$* of 0.36 $m_e$ for the band edge is used [19, 28]. For T>400 K, it is believed that the heavy-hole band dominates, and a temperature independent effective mass of 2.0 $m_e$ is used [8, 20, 29]:

$$m_p^*(T)/m_e=\text{Exp}[\ln(0.36)+0.8^*\ln(T/300)](T<400\text{ K})=2.0(T>400\text{ K}) \quad (8)$$

This assumption has relatively little impact on the results, though, as hole conduction is found to be negligible.

With the help of Eq. 6-8, n, p, $S_n$ and $S_p$ can be written as functions of a single variable (reduced Fermi level for electrons, according to Eq. 1 and Eq. 2. Substituting these parameters to Eq. 3-5, $\xi$, $\mu_m$ and $\mu_p$ can then be solved from the measured $\sigma$, S and $R_H$ at each temperature. A least square fitting is employed; the tolerance $t=(\sigma_{cal}/\sigma_{mea}-1)^2+(S_{cal}/S_{mea}-1)^2+(R_{Hcal}/R_{Hmea}-1)^2$ is minimized. Here, the subscripts cal and mea refer to the calculation and measurement, respectively. The results shown have a tolerance less than 1%. For clarity, only two sets of calculated results (solid lines) for $\sigma$, S and $R_H$ are compared to the raw data in FIG. 1.

The exact assumptions of transport parameters for holes have little effect on the results in this study, and their presence is only included to ensure a full, self-consistent model. In fact, the conclusions described below can also be obtained from a single band analysis. To quantify, the partial hole-conductivity has a <1% contribution to the total electrical conductivity over the entire temperature range investigated.

Figure 4:
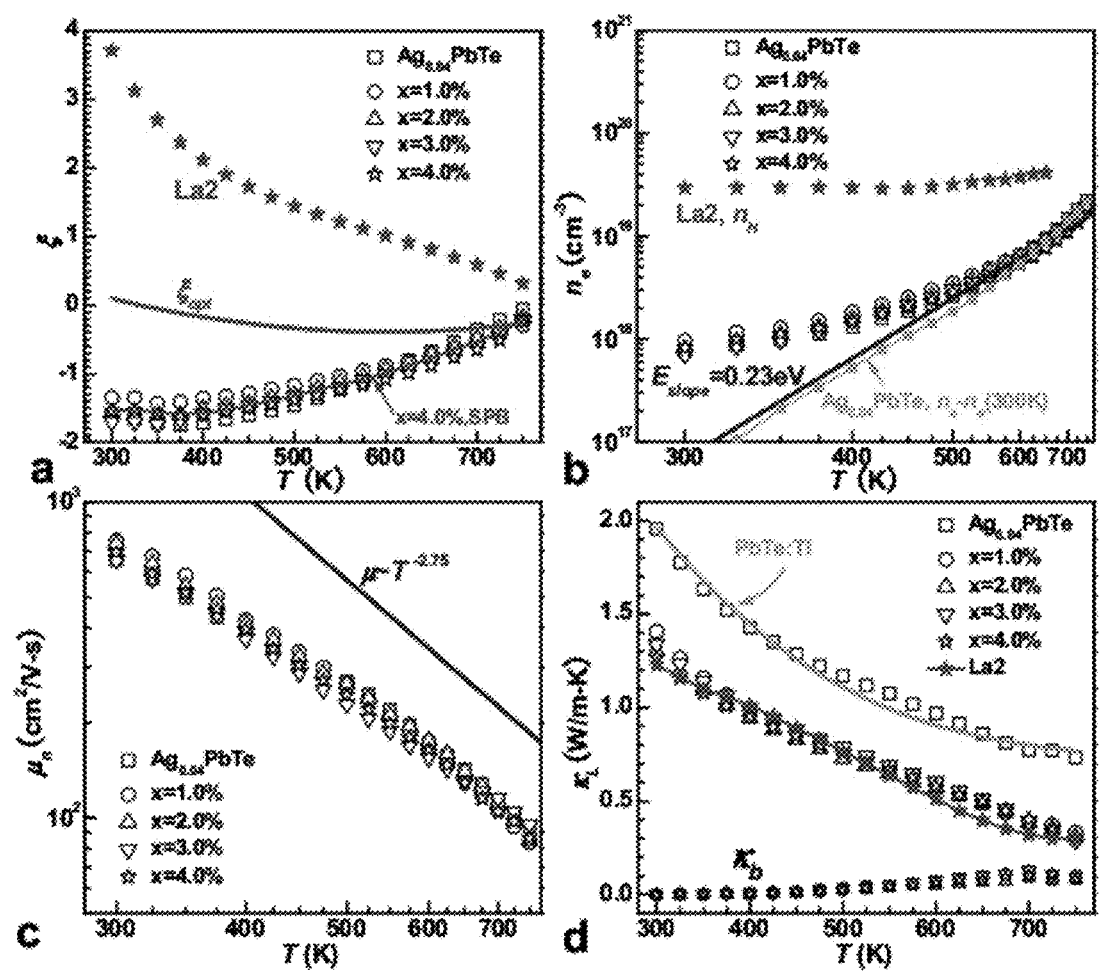
FIG. 4 demonstrates, in accordance with an embodiment of the invention, temperature dependent transport parameters obtained by two band model. Reduced chemical potential (a), extrinsic electron density $n_e$ (b), electron mobility $\mu_n$ (c) and the lattice/bipolar thermal conductivity $\kappa_b$ (d).

The resulting $\xi$(T) is shown in FIG. 4a. For typical thermoelectric semiconductors, whose extrinsic carrier density is temperature independent, $\xi$ decreases with temperature due to the broadened Fermi distribution, as seen for the (La$_{0.02}$PbTe$_{1.02}$)$_{0.945}$(Ag$_2$Te)$_{0.055}$ sample (La$_2$) [7]. The Ag-doped series shows a strikingly different trend, which strongly indicates an increased carrier density with increasing temperature. The negative values of indicate that the Fermi level is located within the band gap for the whole temperature range studied, which is consistent with our above understanding that the materials here are only weakly degenerate and the carrier electrical transport is dominated by the conduction band edge.

The difference between the La$_2$ and PbTe:Ag/Ag$_2$Te samples can be traced to the extrinsic carrier concentration. Assuming all the minority holes, and an equal amount of additional electrons, come from thermal excitation, the extrinsic electron concentration is $n_e=n-p$. FIG. 4b clearly shows $n_e$ increasing by more than an order of magnitude from 300 to 750 K in PbTe:Ag/Ag$_2$Te samples. This can be explained by an increased solubility of Ag in PbTe leading to additional extrinsic carriers. Such an effect due to increased dopant solubility with temperature has been observed in similar materials (Cu, Ag)$_x$PbSe [16, 17] and Pb$_{1+x}$Te [10, 30, 31]. In Pb$_{1+x}$Te, the extrinsic electron density $n_e$ increases with 1/T in a practically exponential relationship with an activation energy of 0.55 eV, which is considered to be the energy required for additional Pb to be dissolved into PbTe [10].

The PbTe:Ag/Ag$_2$Te samples show $n_e$ increasing with an activation energy of 0.23 eV between 450-750 K. The lower activation energy of Ag compared to Pb [31] can be understood as a lower energy to produce a Ag interstitial [7, 23] in PbTe. The high solubility of interstitial Ag and low activation energy for increased Ag solubility results in a carrier density fortuitously close to the optimal level as discussed below.

The unusually rapid decrease in electron mobility (FIG. 4c) can be understood from the temperature dependent effective mass (FIG. 3b). In a material with non-degenerate electrons scattered by acoustic phonons, the relationship between carrier mobility $\mu$ and $m^*$ and T is approximately $\mu \propto m^{*-2.5}T^{1.5}$ [19]. With $\partial \ln(m^*)/\partial \ln T=0.5$ (FIG. 3b) for electrons, a theoretical $T^{2.75}$ dependence of $\mu_n$ is predicted and shown in FIG. 4c.

The calculated partial Lorenz numbers (L) for both electrons and holes, according to SPB model [3, 19], are very close to the $1.5\times10^{-8}$ $V^2/K^2$ predicted for non-degenerate charge carriers (scattered by acoustic phonons) [3].

The bipolar thermal conductivity $K_b$ calculated from $K_b=\sigma_n\sigma_p T(S_n-S_p)^2/(\sigma_n+\sigma_p)$ (FIG. 4d) has a maximum of ~0.15 W/m-K at ~700 K, which is about 30% of the lattice component and is thus an important electronic contribution to consider. Compared with $Bi_2Te_3$ [24], both the contribution of $K_b$ to the total thermal conductivity and its temperature dependence are much weaker in PbTe:Ag/Ag$_2$Te due to the increase in $n_e$ with temperature. Thus, $K_b$ in PbTe:Ag/Ag$_2$Te does not significantly degrade the overall thermoelectric performance, even at high temperatures.

It has been shown that the presence of large nanometer-sized Ag$_2$Te precipitates effectively scatters the phonons [7] in PbTe. The La-doped [7] and the Ag-doped system reported here show lattice thermal conductivity as low as ~0.5 W/m-K at T>600 K (FIG. 4d). In the absence of the Ag$_2$Te precipitates, Ag$_{0.04}$PbTe has higher $K_L$, similar to Tl-doped PbTe [32].

Figure 5:
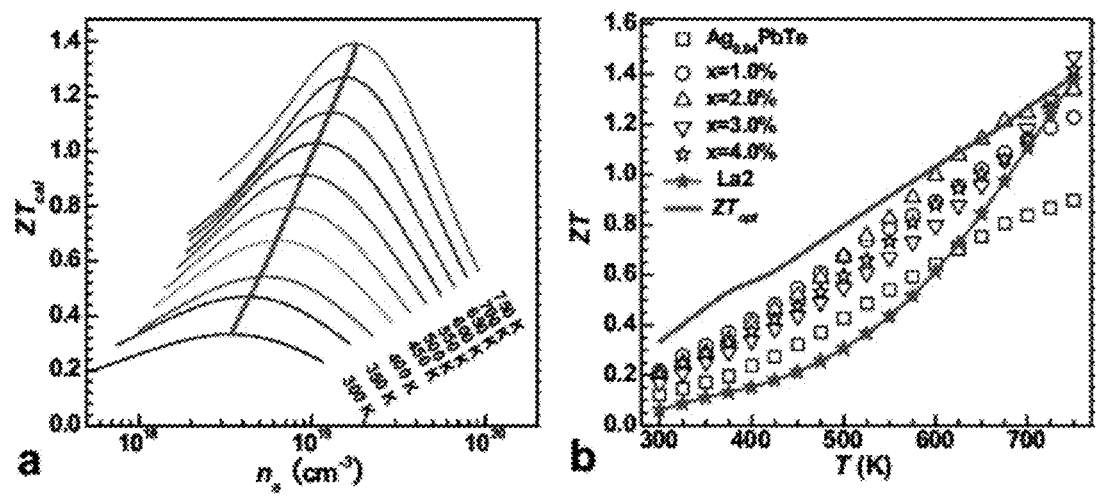
FIG. 5 demonstrates, in accordance with an embodiment of the invention, (a) calculated ZT versus $n_e$ at different temperatures and (b) comparison of zT between Ag-doped and 2% La-doped $(PbTe)_{0.945}(Ag_2Te)_{0.05}$. The optimal zT curve represents the best functionally-graded material within this system, and is nearly achieved in the Ag-doped composite.

Using the detailed transport model (Eq. 1-8), the zT at different $n_e$ can be calculated as a function of temperature (FIG. 5a). This figure shows how the $n_e$ of maximum zT increases with temperature. This optimum $zT_{opt}$ and its corresponding $n_e$ and $\xi_{opts}$ are shown as red lines in FIGS. 5a, 5b and 4a. With a spontaneously adjusted carrier density, the Ag-doped system shows a much closer zT to the predicted $zT_{opt}$, than does the best composition in La-doped system (La2) [7]. Here $\mu=\mu_0\sqrt{\pi}F_{0.5}(\xi)/2F_{0.5}(\xi)\sqrt{\pi F}$ is used to model the mobility change with $n_e$ [3, 19], with $\mu_0$ and $K_L$ estimated from the experimental data.

Even though the La and Ag samples have similar peak zT, the Ag sample will have higher TE efficiency related to its higher average zT over the entire temperature range of interest (FIG. 5b). Calculating the exact TE material efficiency [12] with $T_c$=300 K and $T_h$=750 K shows a ~50% improvement due to the self-optimization of $n_e$, from 6.5% for $(La_{0.02}PbTe_{1.02})_{0.945}(Ag_2Te)_{0.005}$ [7] to 9.7% for $(Ag_{0.02}PbTe)_{0.945}(Ag_2Te)_{0.055}$. There is also a significant improvement of ~25%, over the n-PbTe used in TE generators currently used by NASA (Teledyne n-PbTe from reference [1]) in the temperature range of 500-750K.

Example 3

Conclusion

In summary, significant enhancement of thermoelectric performance is found in PbTe/Ag$_2$Te with excess Ag, and is explained by the temperature-dependent solubility limit of metallic Ag which provides an increase in the carrier density with increasing temperature. Both the TE efficiency dependence on $n_e$, and the temperature dependent solubility of dopants are general phenomena in the field of thermoelectrics, making this approach to functionally graded thermoelectric materials generally applicable to other systems.

REFERENCES

[1] G. J. Snyder, Appl Phys Lett 84, 2436 (2004).
[2] G. J. Snyder, and E. S. Toberer, Nat Mater 7, 105 (2008).
[3] D. M. Rowe, *CRC handbook of thermoelectrics* (CRC Press, Boca Raton, Fla., 1995), p. 701 p.
[4] E. S. Toberer, A. F. May, and G. J. Snyder, Chem Mater 22, 624 (2010).
[5] A. F. Ioffe, *Semiconductor thermoelements, and Thermoelectric cooling* (Infosearch, London, 1957), p. 184p.
[6] R. F. Pierret, *Advanced semiconductor fundamentals* (Pearson Education, Upper Saddle River, N.J., 2003), pp. x.
[7] Y. Pei et al, Adv. Func. Mat. 21, 241 (2011).
[8] L. M. Sysoeva et al., Sov Phys Semicond+ 3, 975 (1970).
[9] B. A. Efimova et al, Sov Phys Semicond+ 4, 1653 (1971).
[10] I. B. Cadoff, and E. Miller, *Thermoelectric materials and devices* (Reinhold Pub. Corp., New York, 1960), pp. xiii.
[11] V. L. Kuznetsov, in *Thermoelectrics handbook: macro to nano*, edited by D. M. Rowe (CRC/Taylor & Francis, Boca Raton, 2006), pp. 1.
[12] G. J. Snyder, in *Thermoelectrics handbook: macro to nano*, edited by D. M. Rowe (CRC/Taylor & Francis, Boca Raton, 2006), pp. 1.
[13] Y. Z. Pei et al, Appl Phys Lett 95, 042101 (2009).
[14] A. F. May, J. P. Fleurial, and G. J. Snyder, Chem Mater 22, 2995 (2010).
[15] E. S. Toberer et al., Adv Funct Mater 18, 2795 (2008).
[16] N. A. Fedorovich, Soviet Physics Solid State, Ussr 7, 1289 (1965).
[17] F. F. Kharakhorin, D. A. Gambarova, and V. V. Aksenov, Soviet Physics Solid State, Ussr 7, 2813 (1966).
[18] M. G. Kanatzidis, Chem Mater 22, 648 (2010).
[19] Y. I. Ravich, B. A. Efimova, and I. A. Smirnov, *Semiconducting lead chalcogenides* (Plenum Press, New York, 1970), pp. xv.
[20] L. M. Rogers, Brit J Appl Phys 18, 1227 (1967).
[21] Y. I. Ravich, B. A. Efimova, and V. I. Tamarche, Physica Stams Solidi B-Basic Research 43, 11 (1971).
[22] S. Ahmad, and S. D. Mahanti, Phys Rev B 81 (2010).
[23] A. J. Strauss, J Electron Mater 2, 553 (1973).
[24] H. J. Goldsmid, *Thermoelectric refrigeration* (Plenum Press, New York, 1964), pp. x.
[25] H. A. Lyden, Physical Review a—General Physics 134, 1106 (1964).
[26] Y. W. Tsang, and M. L. Cohen, Phys Rev B 3, 1254 (1971).
[27] D. I. Bilc, S. D. Mahanti, and M. G. Kanatzidis, Phys Rev B 74 (2006).
[28] S. V. Airapetyants et al., Soviet Physics Solid State, Ussr 8, 1069 (1966).
[29] A. J. Crocker, and L. M. Rogers, J Phys-Paris 29, C4 (1968).
[30] W. Scanlon, Phys Rev 126, 509 (1962).
[31] E. Miller, I. Cadoff, and K. Komarek, J Appl Phys 32, 2457 (1961).
[32] J. Heremans et al, Science 321, 554 (2008).

What is claimed is:

1. A composition comprising excess dopant, wherein: (1) the composition comprises PbTe/Ag$_2$Te; (2) the excess dopant comprises Ag; and (3) the excess dopant has an increasing solubility limit with increasing temperature (T).

2. The composition of claim 1, wherein the increasing solubility limit with increasing T is within a temperature range of high thermoelectric performance.

3. The composition of claim 1, wherein the composition has a dimensionless figure of merit (zT) of no less than 1.4 at 750 K.

4. The composition of claim 1, wherein the temperature-dependent solubility limit of the dopant in the composition results in an increase in carrier concentration (n) with increasing T.

5. The composition of claim 1, wherein the composition is represented by a formula: $(Ag_xPbTe)_{0.945}(Ag_2Te)_{0.055}$.

6. The composition of claim 5, wherein $0.005 \leq x \leq 0.1$.

7. A method of using a composition comprising PbTe/$Ag_2Te$ in a thermoelectric device, wherein: (1) the composition comprises excess dopant; (2) the excess dopant comprises Ag; and (3) the excess dopant has an increasing solubility limit with increasing temperature (T), within a temperature range of high thermoelectric performance.

8. The method of claim 7, further comprising: applying a temperature gradient to the thermoelectric device; and collecting electrical energy.

9. The method of claim 7, wherein the composition has a dimensionless figure of merit (zT) of no less than 1.4 at 750K.

10. The method of claim 7, wherein the temperature-dependent solubility limit of the dopant in the composition results in an increase in carrier concentration (n) with increasing temperature (T).

11. The method of claim 7, wherein the composition is represented by a formula: $(Ag_xPbTe)_{0.945}(Ag_2Te)_{0.055}$.

12. The method of claim 11, wherein $0.005 \leq x \leq 0.1$.

\* \* \* \* \*